US009660177B2

(12) United States Patent
Annapragada et al.

(10) Patent No.: US 9,660,177 B2
(45) Date of Patent: May 23, 2017

(54) METHOD TO MINIMIZE MTJ SIDEWALL DAMAGE AND BOTTOM ELECTRODE REDEPOSITION USING IBE TRIMMING

(71) Applicant: Headway Technologies, Inc., Milpitas, CA (US)

(72) Inventors: Rao Annapragada, Union City, CA (US); Yu-Jen Wang, San Jose, CA (US); Dongna Shen, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 93 days.

(21) Appl. No.: 14/848,378

(22) Filed: Sep. 9, 2015

(65) Prior Publication Data
US 2017/0069834 A1 Mar. 9, 2017

(51) Int. Cl.
H01L 41/22 (2013.01)
H01L 43/12 (2006.01)
H01L 41/12 (2006.01)
H01L 43/08 (2006.01)
H01L 41/47 (2013.01)
H01L 41/06 (2006.01)
H01L 27/22 (2006.01)
H01L 43/02 (2006.01)

(52) U.S. Cl.
CPC ............ H01L 41/47 (2013.01); H01L 27/224 (2013.01); H01L 41/06 (2013.01); H01L 41/12 (2013.01); H01L 43/02 (2013.01); H01L 43/08 (2013.01); H01L 43/12 (2013.01)

(58) Field of Classification Search
CPC ......... H01L 41/06; H01L 41/12; H01L 41/47; H01L 43/02; H01L 43/08; H01L 43/12; H01L 27/222; H01L 27/224; H01L 27/226
See application file for complete search history.

(56) References Cited

U.S. PATENT DOCUMENTS

| 8,691,596 | B2 | 4/2014 | Nomachi | |
|---|---|---|---|---|
| 8,728,333 | B2 | 5/2014 | Wang et al. | |
| 2005/0020011 | A1* | 1/2005 | Nakajima | B82Y 10/00 438/257 |
| 2006/0132983 | A1 | 6/2006 | Osugi et al. | |

(Continued)

OTHER PUBLICATIONS

PCT Search Report, International Application No. PCT/US2016/050854, Applicant: Headway Technologies, Inc., Mail date: Dec. 9, 2016, 14 pgs.

Primary Examiner — Julio J Maldonado
Assistant Examiner — Molly Reida
(74) Attorney, Agent, or Firm — Saile Ackerman LLC; Stephen B. Ackerman; Rosemary L. S. Pike

(57) ABSTRACT

An improved method for etching a magnetic tunneling junction (MTJ) structure is achieved. A stack of MTJ layers is provided on a bottom electrode. The MTJ stack is patterned to form a MTJ device wherein sidewall damage or sidewall redeposition is formed on sidewalls of the MTJ device. A dielectric layer is deposited on the MTJ device and the bottom electrode. The dielectric layer is etched away using ion beam etching at an angle relative to vertical of greater than 50 degrees wherein the dielectric layer on the sidewalls is etched away and wherein sidewall damage or sidewall redeposition is also removed and wherein some of the dielectric layer remains on horizontal surfaces of the bottom electrode.

14 Claims, 6 Drawing Sheets

(56) References Cited

U.S. PATENT DOCUMENTS

| | | | |
|---|---|---|---|
| 2010/0097846 A1* | 4/2010 | Sugiura | G11C 11/16 365/158 |
| 2011/0198314 A1 | 8/2011 | Wang et al. | |
| 2012/0032288 A1* | 2/2012 | Tomioka | H01L 43/08 257/421 |
| 2014/0170776 A1 | 6/2014 | Satoh et al. | |
| 2014/0227804 A1* | 8/2014 | Hsu | H01L 43/12 438/3 |
| 2015/0044781 A1 | 2/2015 | Tokashiki | |
| 2015/0104882 A1 | 4/2015 | Jung et al. | |

* cited by examiner

METHOD TO MINIMIZE MTJ SIDEWALL DAMAGE AND BOTTOM ELECTRODE REDEPOSITION USING IBE TRIMMING

TECHNICAL FIELD

This application relates to the general field of magnetic tunneling junctions (MTJ) and, more particularly, to etching methods for forming MTJ structures.

BACKGROUND

A typical MTJ etched by a RIE (reactive ion etching) process is found to have sidewall damage, possibly caused by oxygen or other chemicals during the RIE etching process. The sidewall damage will lead to a size dependence of magnetic resistance ratio (DRR) which will reduce the read margin for the MRAM (magneto-resistive random-access memory) chip functionality. One effective way to eliminate sidewall damage is the use of a pure physical etching process such as IBE (ion beam etching). According to our device data, the pure IBE process or RIE+IBE trimming process will eliminate the size dependence of MR (magneto-resistance) ratio. This means the sidewall damaged layer could be removed by an IBE or RIE+IBE process. However, one drawback of IBE or RIE+IBE is the sidewall redeposition from the bottom electrode when the IBE process is performed. The sidewall redeposition of the bottom electrode will lead to the shunting path around the MTJ sidewall and then lead to low yield for the MRAM chip.

Several patents show the use of IBE in removing damage. These include U.S. Pat. No. 8,728,333 (Wang et al) and US Patent Applications 2015/0104882 (Jung et al) and 2015/0044781 (Tokashiki). U.S. Pat. No. 8,691,596 (Nomachi) shows a sacrificial layer of silicon dioxide in an IBE process.

SUMMARY

It is an object of the present disclosure to provide an improved etching process in forming MTJ structures.

Yet another object of the present disclosure is to provide an etching process for MTJ devices that removes sidewall damage.

A further object is to provide an etching process that eliminates sidewall redeposition on MTJ devices.

In accordance with the objectives of the present disclosure, a method for etching a magnetic tunneling junction (MTJ) structure is achieved. A stack of MTJ layers is provided on a bottom electrode. The MTJ stack is patterned to form a MTJ device wherein sidewall damage or sidewall redeposition is formed on sidewalls of the MTJ device. A dielectric layer is deposited on the MTJ device and the bottom electrode. The dielectric layer is etched away using ion beam etching at an angle of greater than 50 degrees wherein the dielectric layer on the sidewalls is etched away and wherein sidewall damage or sidewall redeposition is also removed and wherein some of the dielectric layer remains on horizontal surfaces of the bottom electrode.

BRIEF DESCRIPTION OF THE DRAWINGS

In the accompanying drawings forming a material part of this description, there is shown.

DETAILED DESCRIPTION

In the present disclosure, a sacrificial layer is used during the IBE process or IBE trimming process. Compared with a pure IBE process, use of the sacrificial layer will ensure that the sidewall damage is removed by the IBE process and, at the same time, minimize or eliminate the sidewall redeposition issue. The concept of utilizing a higher etch rate of the sidewall compared to the bottom during IBE is a novel feature of this disclosure. Because of this ability, we are able to remove all the sidewall dielectric as well as the chemically damaged layer while ensuring that there is always some dielectric remaining on the bottom protecting the bottom electrode.

The existing IBE or RIE+IBE etching uses the IBE to etch the MTJ device which will ideally clean the sidewall without any chemical damage since IBE is a pure physical etching process. In the real MRAM device, however, the bottom electrode is always bigger than the MTJ device and the IBE process will also etch the bottom electrode during the IBE. The physical etching of the bottom electrode causes metal redeposition around the MTJ sidewall and forms a shorting path around the MTJ device.

Figure 1A:
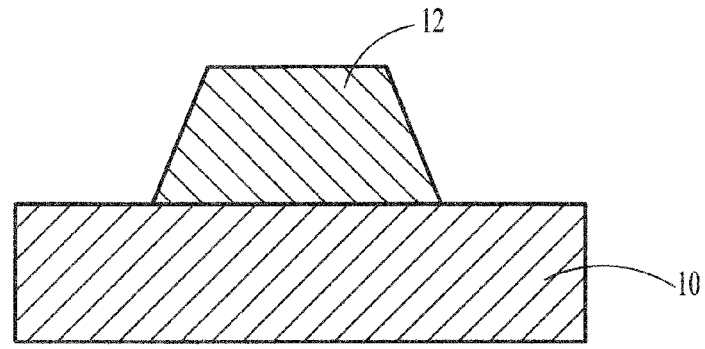
FIG. 1A illustrates in cross-sectional representation a MTJ device after a typical RIE process.

As can be seen from FIG. 1A, the bottom electrode 10 has no recession issue for the MTJ 12 etched by RIE due to the high etch selectivity achieved by using different etching gas in MTJ etching. For example, methanol ($CH_3OH$) or Argon and methanol has a high selectivity to tantalum, often used as the bottom electrode.

Figure 1B:
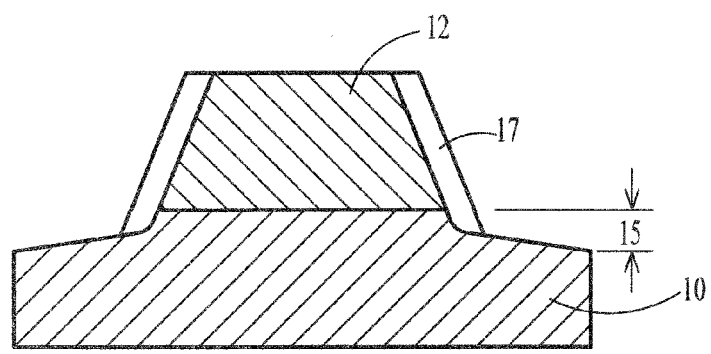
FIG. 1B illustrates in cross-sectional representation a MTJ device after a typical IBE process.

On the other hand, the MTJ with IBE process is shown in FIG. 1B. Since the IBE process is a pure physical etching process without any etch selectivity, the recess 15 of the bottom electrode 10 cannot be avoided. A severe side-wall redeposition 17 from the IBE process leads to electrical shorting of the MRAM device where the redeposition 17 contacts the electrode 10.

Minimizing the side wall redeposition from the IBE process will be a key requirement to successfully commercializing the IBE process/tool for MRAM production.

In this disclosure, we propose a combination of dielectric deposition with ion beam etching process to achieve a MTJ device with no chemically damaged sidewall as well as no sidewall redeposition issues.

Figure 2A:
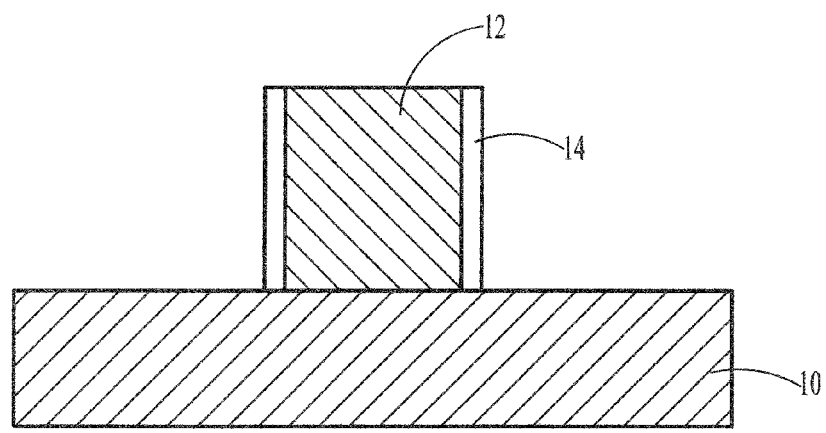
FIGS. 2A through 2D illustrate in cross-sectional representation steps in a first preferred embodiment of the present disclosure.
Figure 2B:
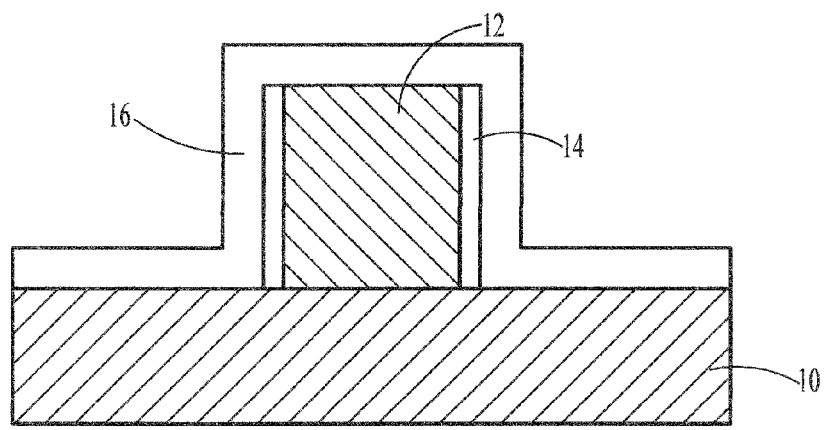
Figure 2C:
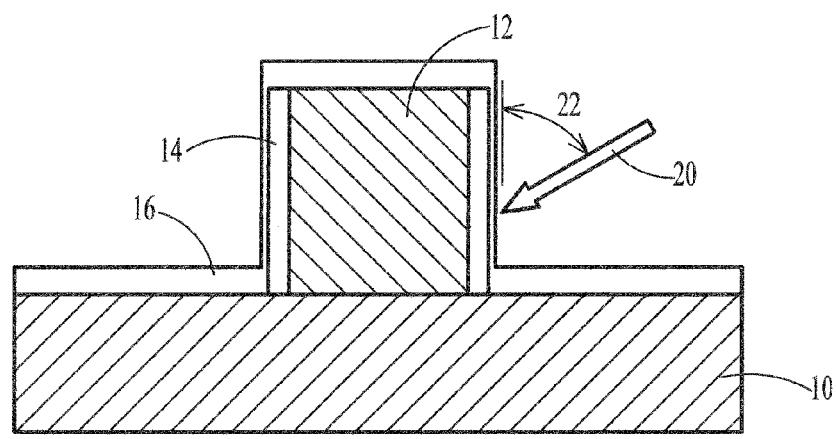
Figure 3A:
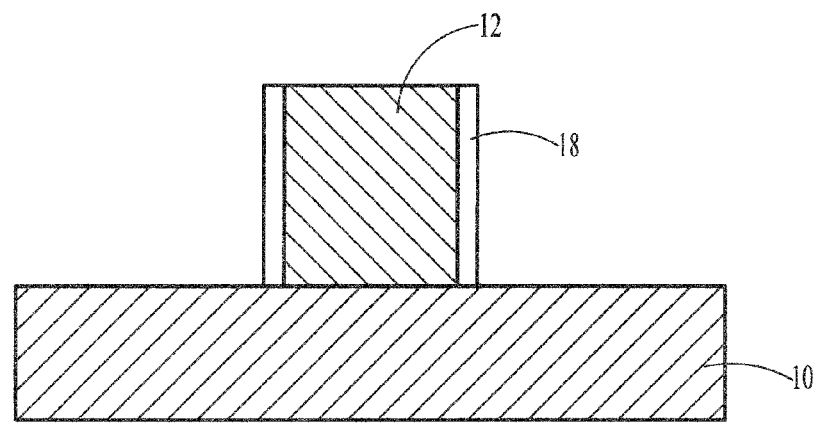
FIGS. 3A through 3D illustrate in cross-sectional representation steps in a second preferred embodiment of the present disclosure.
Figure 3B:
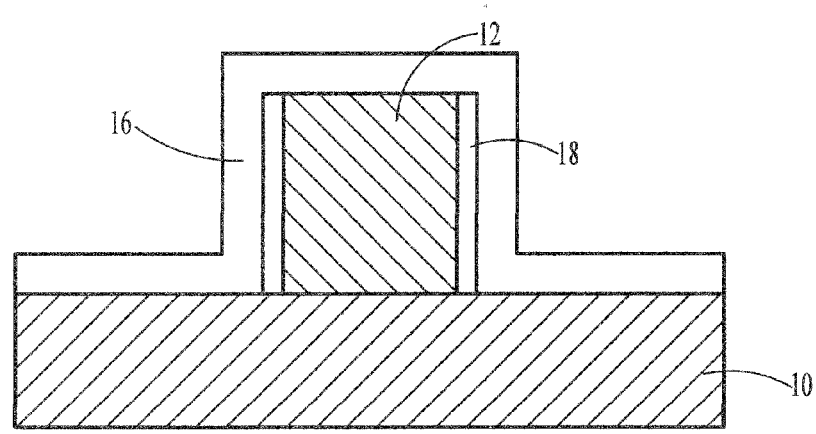
Figure 3C:
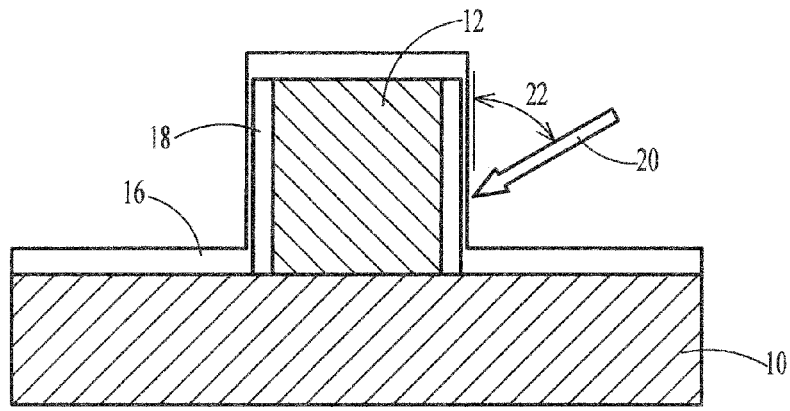
Figure 4A:
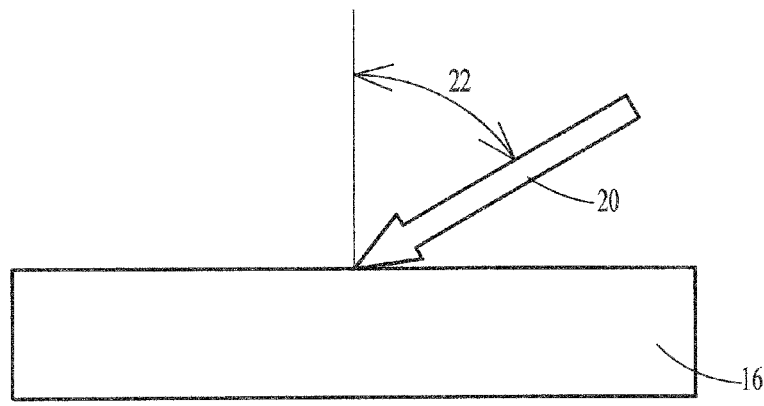
FIG. 4A illustrates in cross-sectional representation an ion beam etching process in a preferred embodiment of the present disclosure.
Figure 4B:
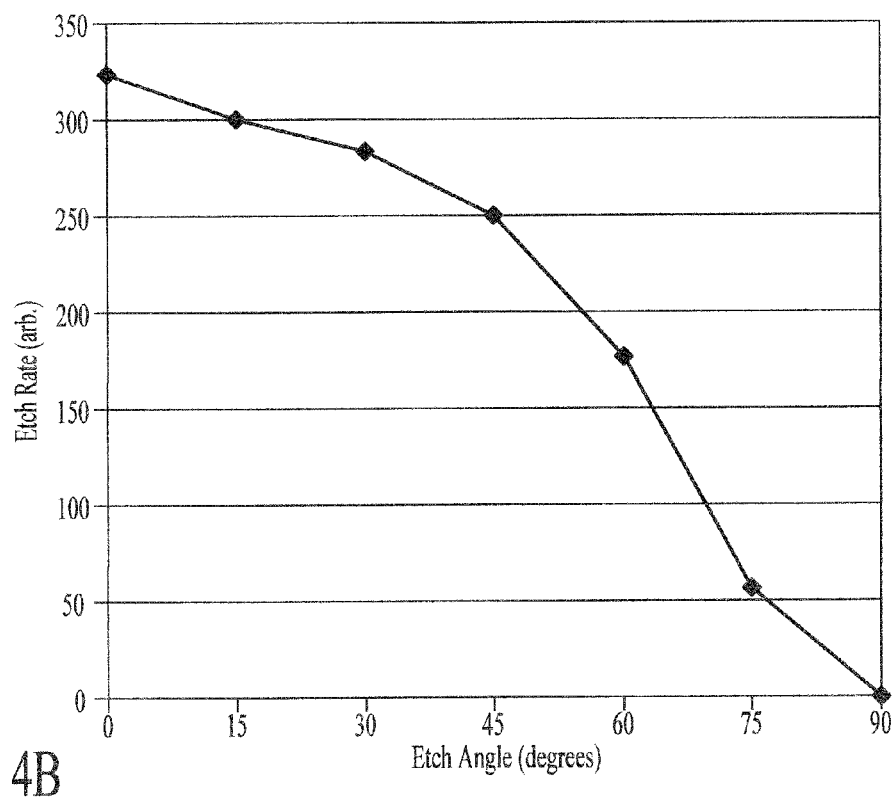
FIG. 4B illustrates in graphical representation IBE injection angle dependence on etching rate.

As can be seen in the FIG. 4B, the etch rate in an IBE process is inversely proportional to the etch angle. In the disclosed process, we prefer to deposit a thin dielectric layer around the MTJ first, as shown in FIGS. 2B and 3B, and then IBE etching with an angle larger than 50 degrees. Due to the etching rate difference between the side and bottom locations, the dielectric layer and sidewall damage layer will be removed by IBE while the bottom electrode is still protected by the dielectric layer as shown in FIGS. 2C and 3C. The concept of utilizing a higher etch rate of the sidewall compared to the bottom is a key feature of this disclosure. Because of this ability, we can remove all the sidewall dielectric as well as the chemically damaged layer while ensuring that there is always some dielectric remaining on the bottom protecting the bottom electrode. Depending on how much dielectric deposits on the sidewall compared to the bottom, it may be necessary to do more than one deposition and IBE etch cycle for optimal results.

The process of the present disclosure removes the chemically damaged sidewall from RIE and also eliminates the problem of redeposition from the bottom electrode, thus minimizing the problem of current shunting which results in low yield of the MRAM chips.

A first preferred embodiment will be described in more detail with reference to FIGS. 2A-2D. Referring now more particularly to FIG. 2A, there is shown a bottom electrode 10. On the bottom electrode is a MTJ 12 that has been patterned using a RIE process. Sidewall damage from the RIE etch is shown by 14 in the drawing figure. Now, an IBE trimming process according to the first preferred embodiment of the disclosure is performed.

First a sacrificial dielectric layer 16 is conformally deposited over the MTJ device and the bottom electrode, as shown in FIG. 2B. For example, the dielectric layer may be silicon dioxide or silicon nitride, having a thickness of between about 50 and 400 Angstroms. Next, as shown in FIG. 2C, an ion beam etching (IBE) process 20 is performed at an angle relative to vertical 22 of greater than 50 degrees, and preferably between about 50 and 80 degrees. This angle dependence of the IBE results in more of the dielectric's being removed from the vertical sidewalls as compared to the horizontal surfaces, as shown in FIG. 2C.

Figure 2D:
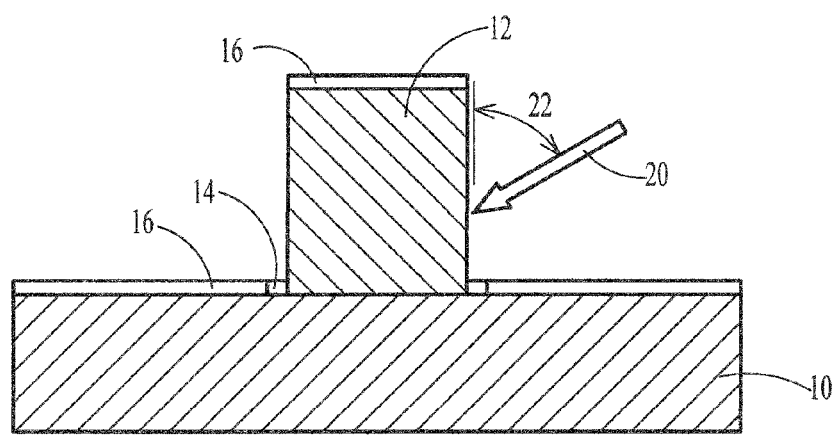

After completion of the IBE, all of the vertical dielectric 16 as well as the sidewall damage 14 has been removed, as shown in FIG. 2D. Some of the dielectric 16 remains on the horizontal surfaces.

A second preferred embodiment will be described in more detail with reference to FIGS. 3A-3D. Referring now more particularly to FIG. 3A, there is shown a bottom electrode 10. On the bottom electrode is a MTJ 12 that has been patterned using a first IBE process. Sidewall redeposition 18 from the bottom electrode during the first IBE etch is shown.

A sacrificial dielectric layer 16 is conformally deposited over the MTJ device and the bottom electrode, as shown in FIG. 3B. For example, the dielectric layer may be silicon dioxide or silicon nitride, having a thickness of between about 50 and 400 Angstroms. Next, as shown in FIG. 3C, an IBE trimming process 20 is performed at a angle relative to vertical 22 of greater than 50 degrees, and preferably between about 50 and 80 degrees. This angle dependence of the IBE results in more of the dielectric's being removed from the vertical sidewalls as compared to the horizontal surfaces, as shown in FIG. 3C.

Figure 3D:
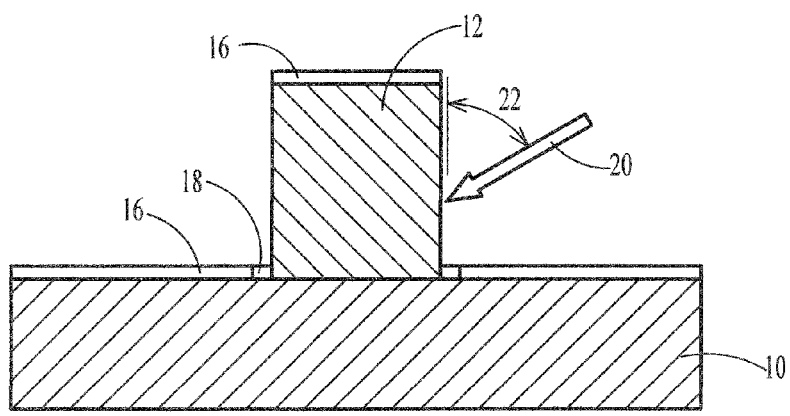

After completion of the IBE trimming process, all of the vertical dielectric 16 as well as the sidewall redeposition 18 has been removed, as shown in FIG. 3D. Some of the dielectric 16 remains on the horizontal surfaces.

FIG. 4A shows the ion beam 20 hitting the film 16 surface with an angle relative to vertical of 22. Preferably, the angle 22 will be between about 50 and 80. FIG. 4B illustrates the etch rate with respect to the etch angle for an IBE process.

The process of the current disclosure will be used for MRAM chips of the size smaller than about 60 nm as problems associated with chemically damaged sidewall and redeposition from bottom electrode become very severe for the smaller sized MRAM chips.

In summary, the IBE or RIE+IBE process of the current disclosure begins with a dielectric layer deposited after the RIE etch or the first IBE etch of the MTJ device. This is followed by an angle-dependent IBE etch used to remove the chemical sidewall damage or bottom electrode redeposition as well as the dielectric deposition on the sidewall while ensuring the dielectric deposition on the bottom electrode is not completely removed to protect the bottom electrode. The angle-dependent IBE etch removes the sidewall dielectric layer faster than the bottom dielectric layer thus ensuring that all the sidewall dielectric as well as the chemical sidewall damage or bottom electrode redeposition is removed while leaving at least some dielectric deposition on the bottom electrode.

Multiple sacrificial dielectric deposition and IBE etch cycles are used, if necessary, to ensure that all the chemical sidewall damage or bottom electrode redeposition as well as sidewall dielectric deposition is removed while some dielectric is always present on the bottom electrode.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for etching a magnetic tunneling junction (MTJ) structure comprising:
   providing a stack of MTJ layers on a bottom electrode;
   patterning said MTJ stack to form a MTJ device wherein sidewall damage or sidewall redeposition is formed on sidewalls of said MTJ device;
   thereafter depositing a dielectric layer on said MTJ device and said bottom electrode; and
   etching away said dielectric layer using ion beam etching at an angle relative to vertical of greater than 50 degrees wherein said dielectric layer on said sidewalls is etched away and wherein said sidewall damage or sidewall redeposition is also removed and wherein some of said dielectric layer remains on horizontal surfaces of said bottom electrode.

2. The method according to claim 1 wherein said MTJ stack is patterned using a reactive ion etch resulting in said sidewall damage to said MTJ device.

3. The method according to claim 1 wherein said MTJ stack is patterned using an ion beam etch resulting in said sidewall redeposition of said bottom electrode material to sidewalls of said MTJ device.

4. The method according to claim 1 wherein said dielectric layer comprises silicon dioxide or silicon nitride having a thickness of between about 50 and 400 Angstroms.

5. The method according to claim 1 wherein said angle is between about 50 and 80 degrees.

6. The method according to claim 1 wherein said steps of depositing said dielectric angle and said ion beam etching are repeated until all of said sidewall damage or said sidewall redeposition is removed.

7. A method for etching a magnetic tunneling junction (MTJ) structure comprising:
   providing a stack of MTJ layers on a bottom electrode;
   patterning said MTJ stack using a reactive ion etch to form a MTJ device wherein sidewall damage is formed on sidewalls of said MTJ device;
   thereafter depositing a dielectric layer on said MTJ device and said bottom electrode; and
   etching away said dielectric layer using ion beam etching at an angle relative to vertical of greater than 50 degrees wherein said dielectric layer on said sidewalls is etched away and wherein said sidewall damage is also removed and wherein some of said dielectric layer remains on horizontal surfaces of said bottom electrode.

8. The method according to claim 7 wherein said dielectric layer comprises silicon dioxide or silicon nitride having a thickness of between about 50 and 400 Angstroms.

9. The method according to claim 7 wherein said angle is between about 50 and 80 degrees.

10. The method according to claim 7 wherein said steps of depositing said dielectric angle and said ion beam etching are repeated until all of said sidewall damage is removed.

11. A method for etching a magnetic tunneling junction (MTJ) structure comprising:
providing a stack of MTJ layers on a bottom electrode;
patterning said MTJ stack using ion beam etching to form a MTJ device wherein sidewall redeposition of said bottom electrode material is formed on sidewalls of said MTJ device;
thereafter depositing a dielectric layer on said MTJ device and said bottom electrode; and
etching away said dielectric layer using ion beam etching at an angle relative to vertical of greater than 50 degrees wherein said dielectric layer on said sidewalls is etched away and wherein said sidewall redeposition is also removed and wherein some of said dielectric layer remains on horizontal surfaces of said bottom electrode.

12. The method according to claim 11 wherein said dielectric layer comprises silicon dioxide or silicon nitride having a thickness of between about 50 and 400 Angstroms.

13. The method according to claim 11 wherein said angle is between about 50 and 80 degrees.

14. The method according to claim 11 wherein said steps of depositing said dielectric angle and said ion beam etching are repeated until all of said sidewall redeposition is removed.

* * * * *